(12) United States Patent
Kato

(10) Patent No.: US 9,589,824 B2
(45) Date of Patent: Mar. 7, 2017

(54) METHOD FOR MANUFACTURING SEMICONDUCTOR DEVICE

(71) Applicant: Toyota Jidosha Kabushiki Kaisha, Toyota-shi, Aichi-ken (JP)

(72) Inventor: Kunihito Kato, Nisshin (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 15/009,090

(22) Filed: Jan. 28, 2016

(65) Prior Publication Data
US 2016/0233123 A1 Aug. 11, 2016

(30) Foreign Application Priority Data

Feb. 9, 2015 (JP) .................................. 2015-023586

(51) Int. Cl.
*H01L 21/683* (2006.01)
*H01L 21/306* (2006.01)

(52) U.S. Cl.
CPC .... *H01L 21/6835* (2013.01); *H01L 21/30604* (2013.01); *H01L 2221/6834* (2013.01); *H01L 2221/68327* (2013.01)

(58) Field of Classification Search
CPC ....... H01L 2224/32145; H01L 21/6835; H01L 25/0657; H01L 33/0079; H01L 21/2007; H01L 2924/3511; H01L 21/6836
See application file for complete search history.

(56) References Cited

U.S. PATENT DOCUMENTS

| 2005/0173064 A1* | 8/2005 | Miyanari ............ H01L 21/6708 156/703 |
| 2005/0253235 A1* | 11/2005 | Hara .................... H01L 23/3171 257/678 |
| 2012/0074599 A1* | 3/2012 | Kim ...................... H01L 21/565 257/793 |
| 2015/0235874 A1* | 8/2015 | Yu ......................... H01L 21/566 438/107 |

FOREIGN PATENT DOCUMENTS

| JP | H05-165036 A | 6/1993 |
| JP | 2011-023438 A | 2/2011 |
| JP | 2014-013801 A | 1/2014 |

* cited by examiner

*Primary Examiner* — Jaehwan Oh
(74) *Attorney, Agent, or Firm* — Dinsmore & Shohl LLP

(57) ABSTRACT

A method for manufacturing a semiconductor device is provided. The method includes a process of applying liquid to one surface of a support substrate; a process of warping the support substrate by a volume change due to a phase transition of the liquid by solidifying the liquid; a process of attaching a semiconductor substrate having a linear expansion coefficient different from that of the support substrate to the support substrate in a heated state; and a process of warping the support substrate due to a linear expansion coefficient difference between the semiconductor substrate and the support substrate by cooling the support substrate to which the semiconductor substrate is attached. A warping direction due to the phase transition is opposite to a warping direction due to the linear expansion coefficient difference.

7 Claims, 11 Drawing Sheets

METHOD FOR MANUFACTURING SEMICONDUCTOR DEVICE

CROSS-REFERENCE TO RELATED APPLICATION

This application claims priority to Japanese Patent Application No. 2015-023586 filed on Feb. 9, 2015, the contents of which are hereby incorporated by reference into the present application.

TECHNICAL FIELD

A technology disclosed herein relates to a method for manufacturing a semiconductor device.

DESCRIPTION OF RELATED ART

In a process of manufacturing a semiconductor device, a semiconductor substrate may be attached to a support substrate for reinforcement of the semiconductor substrate. For example, after the semiconductor substrate is attached to the support substrate, the semiconductor substrate is thinned, thereby enabling manufacture of a thin semiconductor device.

Japanese Patent Application Publication No. 2011-23438 (hereinafter referred to as patent document 1) discloses a technology in which a laminate substrate is prepared by attaching a semiconductor substrate to a support substrate in a heated state and then the laminate substrate is cooled down to a room temperature. Since the semiconductor substrate and the support substrate have different linear expansion coefficients, there is a risk of warpage of the laminate substrate during the cooling. In the technology of patent document 1, such warpage of the laminate substrate is prevented in the following manner. First, before the semiconductor substrate is attached to the support substrate, the support substrate is warped in advance by heat-treating the support substrate at a temperature higher than its distortion point. Then, the semiconductor substrate is attached to the support substrate thus warped in a heated state. After that, when the laminate substrate is cooled, the laminate substrate is warped due to the linear expansion coefficient difference. The warpage due to the linear expansion coefficient difference corrects the warpage of the support substrate warped in advance. That is, the warpage of the support substrate warped in advance is corrected by the warpage due to the linear expansion coefficient difference. As a result, a flat laminate substrate can be thus obtained after the cooling.

BRIEF SUMMARY

In the technology of patent document 1, the support substrate is warped by heat-treating the support substrate at a temperature higher than the distortion point (i.e. at a temperature of 600° C. or higher). Depending on a material of the support substrate, the distortion point may be a higher temperature. In this case, the support substrate needs to be heat-treated at a higher temperature. However, large-scale equipment is needed for such high-temperature heat treatment to be performed in a manufacturing line. Further, it takes a long time to stably generate such a high temperature. For these reasons, the method of patent document 1 had difficulties in efficiently manufacturing semiconductor devices. Therefore, the present specification provides a technology that makes it possible to warp a support substrate at a lower temperature.

A method for manufacturing a semiconductor device is disclosed herein. The method comprises processes of applying, warping due to a phase transition, attaching, and warping due to a linear expansion coefficient difference. In the process of applying, liquid is applied to one surface of a support substrate. In the process of warping due to the phase transition, the support substrate is warped by a volume change due to a phase transition of the liquid by solidifying the liquid (into a solid). In the process of attaching, a semiconductor substrate having a linear expansion coefficient different from that of the support substrate is attached to the support substrate in a heated state. In the process of warping due to the linear expansion coefficient difference, the support substrate is warped due to the linear expansion coefficient difference between the semiconductor substrate and the support substrate by cooling the support substrate to which the semiconductor substrate is attached. A warping direction due to the phase transition is opposite to a warping direction due to the linear expansion coefficient difference.

It should be noted that the "volume change" may be either expansion or contraction. Further, either the "warping process due to the phase transition" or the "warping process due to the linear expansion coefficient difference" may be performed prior to the other. Further, the term "attaching" encompasses both of the following: heating the semiconductor substrate and the support substrate that are separated from each other and attaching the semiconductor substrate to a surface of the support substrate while maintaining the heated state; and attaching the semiconductor substrate to the support substrate before heating and heating the semiconductor substrate and the support substrate while maintaining the attached state. Further, the term "warping" means changing a degree of warpage of the support substrate. The term "warping" encompasses both of the following: increasing the degree of warpage of the support substrate (e.g. warping the support substrate when it is flat); and decreasing the degree of warpage of the support substrate (e.g. flattening the support substrate when it is warped). Further, the term "opposite" means that one warpage is corrected by the other warpage.

This method includes applying the liquid to one surface of the support substrate and warping the support substrate by the volume change due to the phase transition of the liquid by solidifying the liquid. The volume change due to the phase transition of the liquid by solidifying the liquid can be effected at a comparatively low temperature (e.g. at a temperature of approximately 300° C.). For this reason, this method allows the support substrate to be warped at the comparatively low temperature.

Further, this method includes attaching the semiconductor substrate to the support substrate in a heated state and then cooling the support substrate to which the semiconductor substrate is attached (hereinafter the support substrate and semiconductor substrate may be collectively referred to as a "laminate substrate"). Since the support substrate has a linear expansion coefficient different from that of the semiconductor substrate, the support substrate has an amount of contraction different from that of the semiconductor substrate during the cooling. For this reason, the laminate substrate is warped due to the linear expansion coefficient difference between the support substrate and the semiconductor substrate during the cooling.

Since the warping direction due to a phase transition is opposite to the warping direction due to the linear expansion coefficient difference, these warpages cancel each other out. As a result, the laminate substrate becomes substantially flat after these processes are performed. Thus, this method can provide a flat laminate substrate.

It should be noted that, as mentioned above, either the warping process due to the phase transition or the warping process due to the linear expansion coefficient difference may be performed prior to the other. When the warping process due to the phase transition is performed first, the support substrate is brought into a warped state in this process. After that, the support substrate (i.e. the laminate substrate) becomes substantially flat in the subsequent warping process due to the linear expansion coefficient difference. When the warping process due to the linear expansion coefficient difference is performed first, the support substrate (i.e. the laminate substrate) is brought into a warped state in this process. After that, the support substrate (i.e. the laminate substrate) becomes substantially flat in the subsequent warping process due to the phase transition.

DETAILED DESCRIPTION

Embodiment 1

Figure 1:
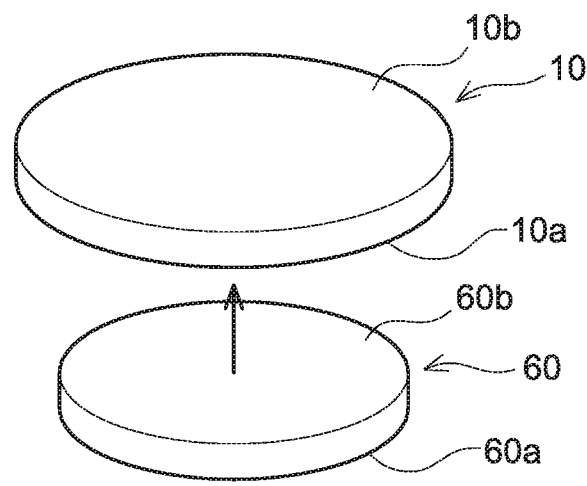
FIG. 1 is a schematic perspective view of a support substrate 10 and a semiconductor substrate 60.

As shown in FIG. 1, in a method for manufacturing a semiconductor device according to Embodiment 1, a semiconductor substrate 60 is attached to a support substrate 10 to reinforce the semiconductor substrate 60. Processing is performed on the reinforced semiconductor substrate 60.

As shown in FIG. 1, the support substrate 10 has a disc shape. The support substrate 10 is configured of a single crystal of sapphire. The support substrate 10 has a thickness of approximately 700 μm. The support substrate 10 (i.e. sapphire) has a linear expansion coefficient of approximately 5.2 ppm/K.

Figure 4:
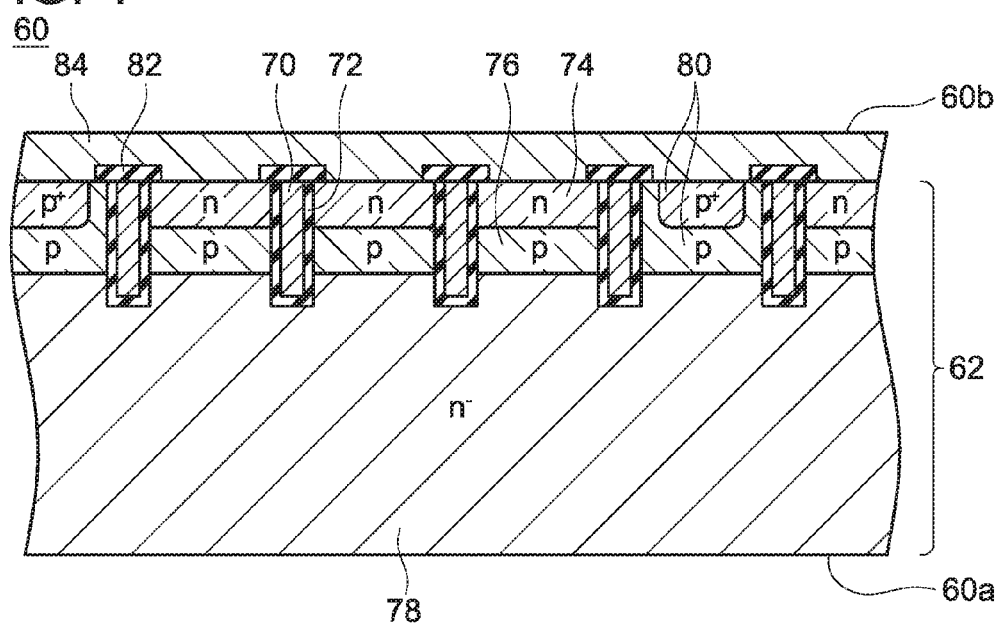
FIG. 4 is a longitudinal sectional view of the semiconductor substrate 60.

As shown in FIG. 1, the semiconductor substrate 60 has a disc shape. The semiconductor substrate 60 has a diameter slightly smaller than that of the support substrate 10. As shown in FIG. 4, the semiconductor substrate 60 has a part of the semiconductor device already formed therein. The semiconductor substrate 60 includes a silicon substrate 62, an electrode provided on the silicon substrate 62, and an insulating layer provided on the silicon substrate 62. The silicon substrate 62 has a linear expansion coefficient of approximately 3.4 ppm/K. Since the semiconductor substrate 60 is configured mostly of the silicon substrate 62, the semiconductor substrate 60 has a linear expansion coefficient substantially equal to that of the silicon substrate 62. That is, the linear expansion coefficient of the semiconductor substrate 60 is smaller than that of the support substrate 10. Provided in an upper surface of the silicon substrate 62 is a plurality of trenches, in each of which a gate electrode 70 and a gate insulating film 72 are disposed. An n-type emitter region 74, a p-type body region 76, an n$^-$-type drift region 78, and a p-type anode region 80 are provided in the silicon substrate 62. The emitter region 74, the body region 76, the drift region 78, the gate electrodes 70, and the like form a part of an IGBT, and the anode region 80 and the drift region 78 form part of a diode. Interlayer insulating films 82 covering the respective gate electrodes 70 are provided on the upper surface of the silicon substrate 62. Further an upper electrode 84 covering the interlayer insulating films 82 and the upper surface of the silicon substrate 62 is provided. The upper electrode 84 has a structure in which AlSi, Ti, Ni, and Au are stacked from a silicon substrate 62 side. The semiconductor substrate 60 has an upper surface 60b configured as an upper surface of the upper electrode 84 and a lower surface 60a configured as a lower surface of the silicon substrate 62. The semiconductor substrate 60 has a thickness of approximately 725 μm.

The following will describe a method for manufacturing a semiconductor device by using the aforementioned support substrate 10 and the semiconductor substrate 60.

(Groove Forming Process)

Figure 2:
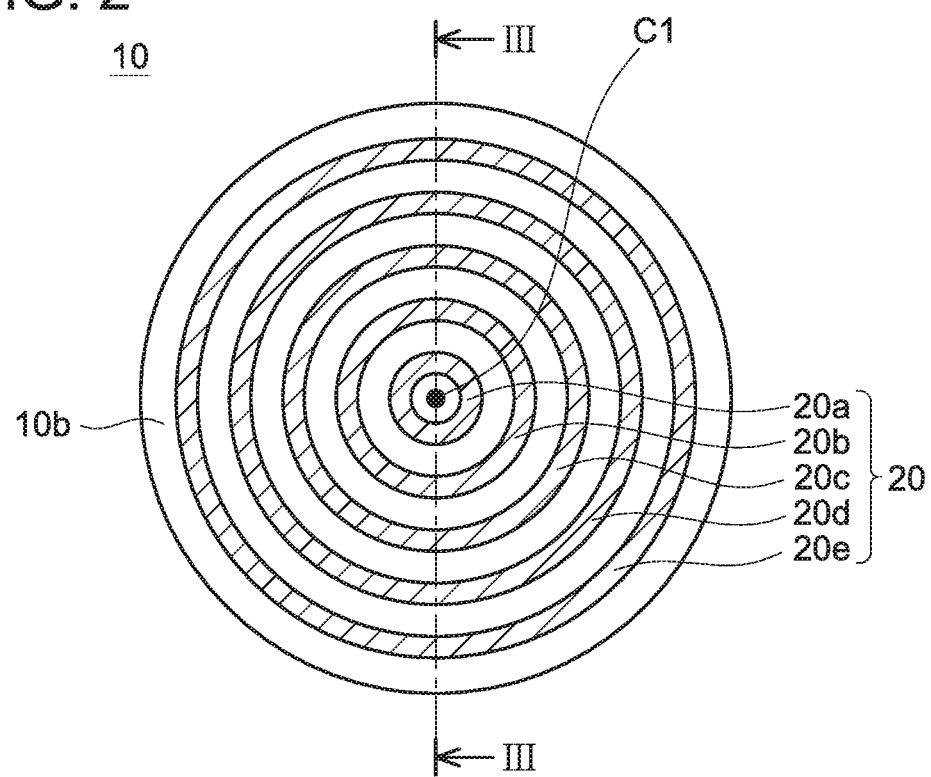
FIG. 2 is a plan view of the support substrate 10, with grooves 20 indicated by diagonal hatching.
Figure 3:
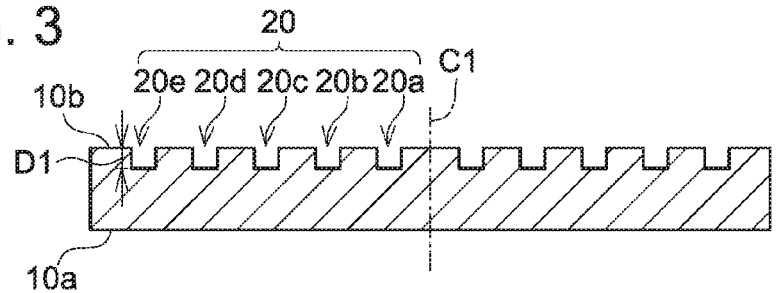
FIG. 3 is a longitudinal sectional view of the support substrate 10 as taken along a line in FIG. 2.

First, as shown in FIGS. 2 and 3, a plurality of grooves 20 (i.e. grooves 20a to 20e) is formed in an upper surface 10b of the support substrate 10. The grooves 20 may be formed by selectively etching the support substrate 10, or may be formed by cutting the support substrate 10. The grooves 20 are formed along a plurality of concentric circles extending around a center C1 of the upper surface 10b. That is, the groove 20a extends circularly around the center C1, and the groove 20b extends circularly around the groove 20a. Similarly, the grooves 20c to 20e extend circularly along concentric circles around the groove 20b. Each of the grooves 20 shown in FIG. 3 has a depth D1 of 100 µm or greater. In the following, the term "upper surface 10b" encompasses inner surfaces of the grooves 20.

(Warpage Adjustment Film Forming Process)

Figure 5:
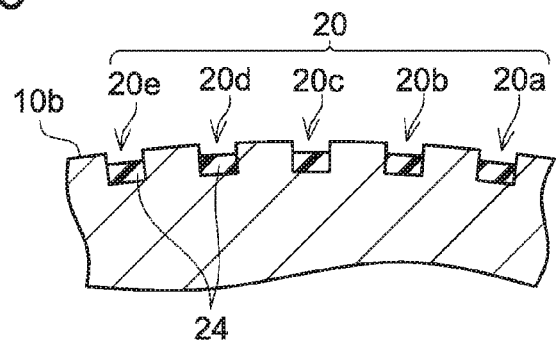
FIG. 5 is an enlarged longitudinal sectional view of the support substrate 10 in which warpage adjustment films 24 have been formed.
Figure 6:
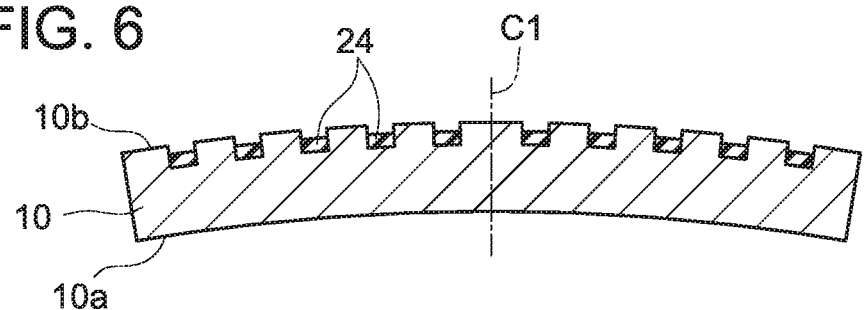
FIG. 6 is a longitudinal sectional view of the support substrate 10 in which the warpage adjustment films 24 have been formed.

Once the grooves 20 are formed, warpage adjustment films 24 configured of spin-on glass (SOG) are formed on the upper surface 10b of the support substrate 10 as shown in FIGS. 5 and 6. The warpage adjustment films 24 are formed as below.

First, while the support substrate 10 is being rotated around its center C1, an SOG solution is applied onto the upper surface 10b of the support substrate 10. Then, the SOG solution flows into each of the grooves 20. Thus, the SOG solution is applied into the grooves 20 of the support substrate 10. At this point, the SOG solution is applied so that a liquid surface of the SOG solution in each of the grooves 20 is located on a bottom side with respect to an opening of the respective groove 20 (i.e. so that the liquid surface is not raised outward from the opening of the groove 20).

Figure 7:
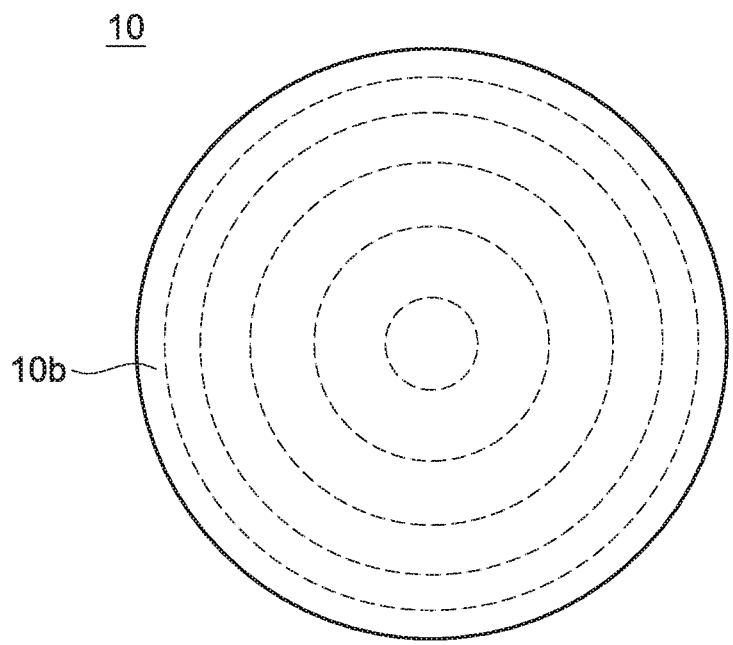
FIG. 7 is a plan view of the support substrate 10 that omits to illustrate the grooves 20 and shows dashed lines indicating contour lines of an upper surface 10b.

Next, the support substrate 10 to which the SOG solution has been applied is heat-treated at a temperature of 300° C. to 400° C. in a furnace. This causes the SOG solution to harden (be solidified) to form the warpage adjustment film 24 configured of SOG (i.e. silicon oxide film) in each of the grooves 20 as shown in FIGS. 5 and 6. The warpage adjustment films 24 expand when they harden. As the warpage adjustment film 24 expands in each groove 20, the warpage adjustment film 24 pushes a side surface of each groove 20 in such a direction as to enlarge a width of each groove 20. For this reason, the support substrate 10 expands on an upper surface 10b side. On the other hand, the support substrate 10 hardly expands on a lower surface 10a side. Therefore, as shown in FIG. 6, the support substrate 10 is warped (i.e. curved) so that the upper surface 10b becomes convex. Since the grooves 20 extend concentrically, the expansion of the warpage adjustment films 24 causes the support substrate 10 to expand in a radial direction on the upper surface 10b side. As a result, as shown in FIG. 6, the support substrate 10 is warped so that the center C1 is raised most. Further, FIG. 7 shows the upper surface 10b of the support substrate 10. It should be noted that FIG. 7 omits to illustrate the grooves 20. Further, dashed lines in FIG. 7 indicate contour lines of the upper surface 10b. As shown in FIG. 7, the contour lines of the upper surface 10b of the support substrate 10 are distributed concentrically, and the center C1 is raised most as compared with an outer periphery portion. The expansion of the warpage adjustment films 24 is permanent. That is, even when the support substrate 10 is brought back to a room temperature after the heat treatment, the warpage adjustment film 24 maintains its volume after the expansion. Therefore, the support substrate 10 maintains its warped state even after the heat treatment.

It should be noted that, as shown in FIG. 5, the warpage adjustment films 24 are formed so that a surface of the warpage adjustment film 24 is located on the bottom side with respect to the opening of each groove 20. That is, the warpage adjustment film 24 is formed only inside of each groove 20. The warpage adjustment film 24 does not project outward from the opening of each groove 20. If the warpage adjustment films 24 project outward from the openings of the grooves 20, asperities will be formed on the upper surface 10b of the support substrate 10. This makes it difficult to handle the support substrate 10 in subsequent processes. For example, the support substrate 10 may become unable to be vacuum sucked. On the other hand, as mentioned above, unless the warpage adjustment films 24 project outward from the openings of the grooves 20, the support substrate 10 can be easily handled.

(Adhesive Applying Process)

Figure 8:
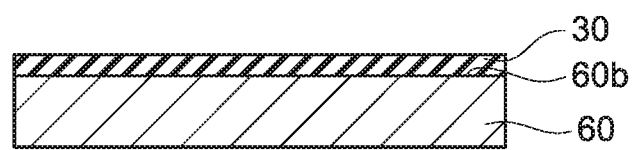
FIG. 8 is a longitudinal sectional view of the semiconductor substrate 60 onto which adhesive 30 has been applied.

Next, as shown in FIG. 8, adhesive 30 is applied onto the upper surface 60b of the semiconductor substrate 60 (i.e. on the upper surface of the upper electrode 84 shown in FIG. 4). The adhesive 30 is applied over an entire area of the upper surface 60b of the semiconductor substrate 60. The adhesive 30 is configured of polyimide resin. At this point, the adhesive 30 is applied to have a thickness of approximately 30 µm. Next, the semiconductor substrate 60 is heat-treated at a temperature of 300° C. for approximately 1 hour. This causes the adhesive 30 to harden. After hardening, the adhesive 30 has a thickness of approximately 20 µm. After curing, the adhesive 30 (i.e. hardened polyimide) has thermal plasticity.

(Attaching and Cooling Process)

Figure 9:
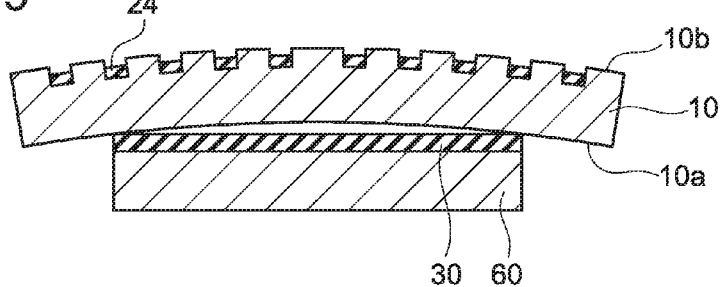
FIG. 9 is a longitudinal sectional view showing a state in which the support substrate 10 is stacked on top of the semiconductor substrate 60.
Figure 10:
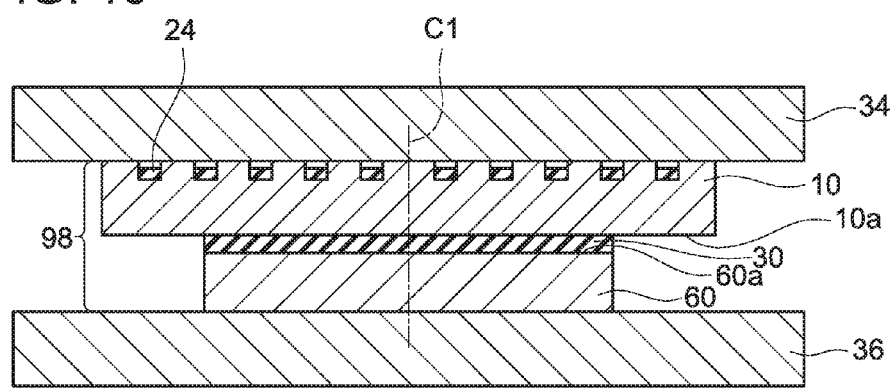
FIG. 10 is a longitudinal sectional view of a laminate substrate 98 in a pressurized state.

Next, as shown in FIG. 9, the support substrate 10 is placed on top of the adhesive 30. That is, the support substrate 10 is stacked on top of the semiconductor substrate 60. At this point, the lower surface 10a (i.e. the concave surface) of the support substrate 10 is brought into contact with the adhesive 30. Next, as shown in FIG. 10, a laminate substrate 98 including the semiconductor substrate 60 and the support substrate 10 is sandwiched from its top to its bottom between upper and lower pressing plates 34 and 36. This causes the laminate substrate 98 to be pressurized in a vertical direction (i.e. in a direction of the lamination). That is, the support substrate 10 is pressed against the semiconductor substrate 60. The pressurization causes the support substrate 10 to become flat so that the lower surface 10a of the support substrate 10 comes into intimate contact entirely with the adhesive 30. Since the warped support substrate 10 is pressurized to be flat, stress that attempts to warp the support substrate 10 so that the upper surface 10b becomes convex is generated in the support substrate 10. This stress is hereinafter referred to as "first stress". Further, as shown in FIG. 10, the support substrate 10 is placed so that the center C1 of the support substrate 10 coincides substantially with a center of the semiconductor substrate 60 in the pressurized state. That is, the center C1 of the support substrate 10 coincides substantially with a center of the laminate substrate 98.

Next, the laminate substrate 98 is heated while being maintained in the pressurized state. At this point, the laminate substrate 98 is heated to a temperature higher than a glass transition temperature of the adhesive 30 (approximately 300° C.). The heating causes the adhesive 30 to soften. Next, the laminate substrate 98 is gradually cooled. When a temperature of the laminate substrate 98 becomes lower than the glass transition temperature of the adhesive 30, the adhesive 30 hardens. This causes the semiconductor substrate 60 and the support substrate 10 to be fixed to each other. That is, the semiconductor substrate 60 is attached to the lower surface 10a (i.e. the surface that had been curved in a concave fashion before the pressurization) of the support substrate 10. After that, the cooling is continued until the laminate substrate 98 reaches a room temperature.

When the laminate substrate 98 is cooled, the support substrate 10 and the semiconductor substrate 60 attempt to contract. Since the support substrate 10 has a linear expansion coefficient larger than that of the semiconductor substrate 60, the support substrate 10 will attempt to contract to a greater degree than the semiconductor substrate 60. Further, at a temperature lower than the glass transition temperature, the upper surface 60b of the semiconductor substrate 60 and the lower surface 10a of the support substrate 10 are fixed to each other with the adhesive 30. When the support substrate 10 attempts to contract to a greater degree than the semiconductor substrate 60 in the state where the semiconductor substrate 60 and the support substrate 10 are fixed to each other, the laminate substrate 98 attempts to warp so that the semiconductor substrate 60 side becomes convex. However, since the laminate substrate 98 is bound by the pressing plates 34 and 36, the laminate substrate 98 is not actually warped. For this reason, stress attempting to warp the laminate substrate 98 so that the semiconductor substrate 60 side becomes convex is generated in the laminate substrate 98. This stress is hereinafter referred to as "second stress".

As mentioned above, the first stress is stress attempting to warp the support substrate 10 so that the upper surface 10b becomes convex. That is, the first stress is stress attempting to warp the laminate substrate 98 so that the semiconductor substrate 60 side becomes concave. The first stress is stress that acts in a direction opposite to the second stress. Therefore, the first stress and the second stress act to cancel each other out.

Once the laminate substrate 98 is cooled to the room temperature, the pressing plates 34 and 36 are set apart, and the laminate substrate 98 is taken out. When the pressing plates 34 and 36 are set apart, high stress acting in the laminate substrate 98, if any, is released to warp the laminate substrate 98. However, in Embodiment 1, the first stress and the second stress, which are generated in the laminate substrate 98, act in opposite directions and therefore the first stress cancels out the second stress. For this reason, the laminate substrate 98 is hardly warped even when the pressing plates 34 and 36 are set apart. The method according to Embodiment 1 can provide the flat laminate substrate 98.

As described above, the method according to Embodiment 1 makes it possible to obtain a flat laminate substrate by making a warping direction of the support substrate 10 in the warpage adjustment film forming process and a warping direction of the support substrate 10 in the attaching and cooling process opposite to each other.

It should be noted that the support substrate 10 contracts mainly in its radial direction during the cooling of the laminate substrate 98. For this reason, stress (i.e. the aforementioned second stress) attempting to warp the laminate substrate 98 so that the center C1 of the laminate substrate 98 is most convex toward a lower side (i.e. the semiconductor substrate 60 side). On the other hand, since, as mentioned above, each of the grooves 20 is formed concentrically, the support substrate 10 expands in its radial direction in the warpage adjustment film forming process. That is, the first stress is stress attempting to warp the laminate substrate 98 so that the center C1 is most convex toward an upper side (i.e. on the support substrate 10 side). Since the first stress and the second stress are substantially symmetrically generated in a plane, the first stress and the second stress can evenly cancel each other out in the plane. For this reason, the method according to Embodiment 1 can provide the flatter laminate substrate 98.

(Polishing Process)

Figure 11:
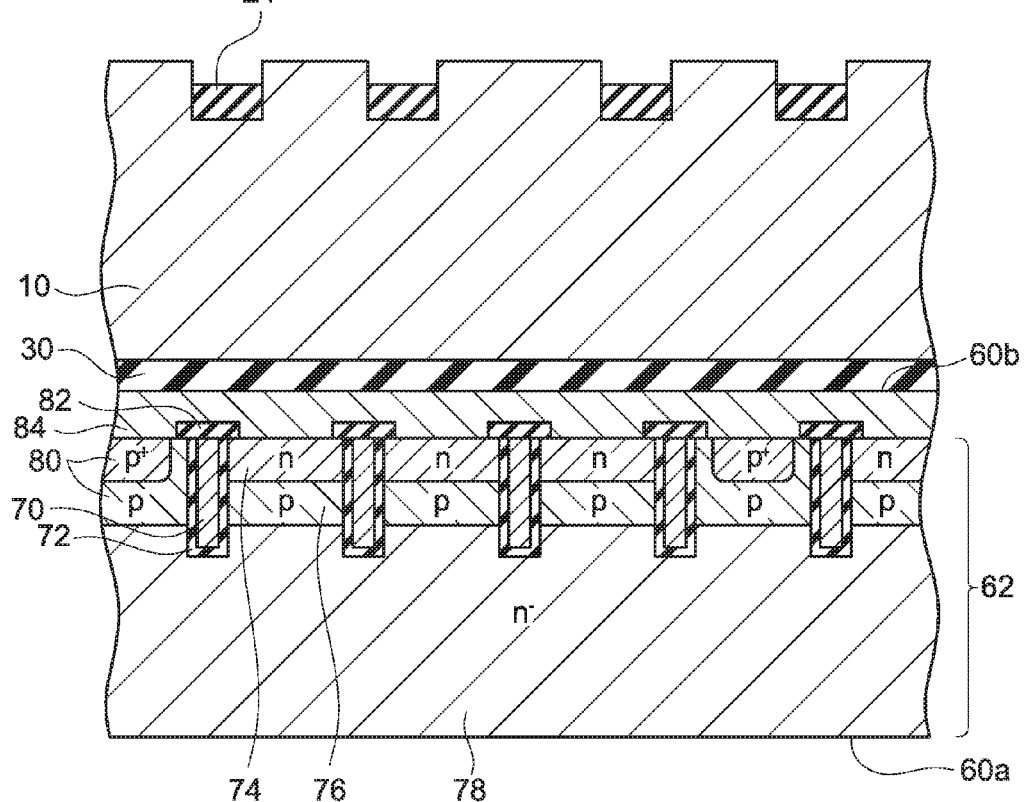
FIG. 11 is a longitudinal sectional view of the semiconductor substrate 60 that has been thinned.

Once the laminate substrate 98 is taken out from the space between the pressing plates 34 and 36, the lower surface 60a of the semiconductor substrate 60 is ground. This causes the semiconductor substrate 60 to be thinned as shown in FIG. 11.

(Wet Etching Process)

Figure 12:
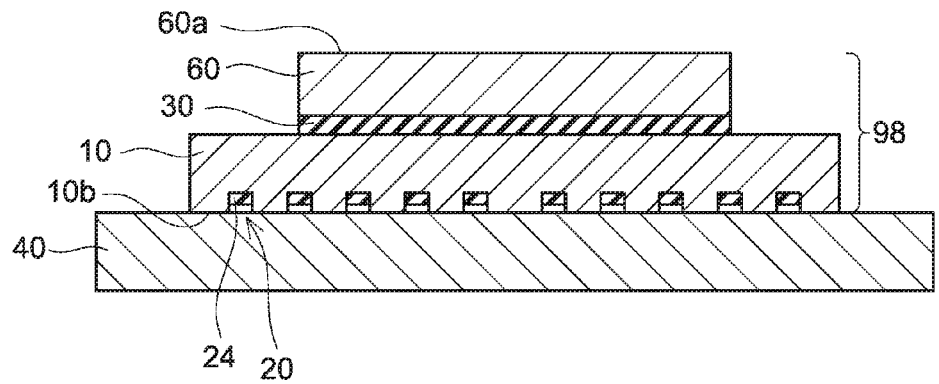
FIG. 12 is an explanatory diagram of wet etching.

After the polishing, the lower surface 60a of the semiconductor substrate 60 is wet etched with hydrofluoric acid. The polishing process and the wet etching process cause the semiconductor substrate 60 to be thinned to have a thickness of approximately 100 μm. The wet etching is conducted in a state where the laminate substrate 98 is mounted on a stage 40 as shown in FIG. 12. That is, the laminate substrate 98 is mounted on the stage 40 so that the upper surface 10b of the support substrate 10 makes contact with a surface of the stage 40. Then, all of the grooves 20 are covered by the stage 40. Since the warpage adjustment films 24 do not project outward from the openings of any of the grooves 20, the stage 40 can be brought into intimate contact with the upper surface 10b located outside of the grooves 20. The laminate substrate 98 is immersed in hydrofluoric acid in a state where the laminate substrate 98 is thus mounted on the stage 40. This causes the lower surface 60a of the semiconductor substrate 60 to be etched. The grooves 20 are covered by the stage 40. Further, the grooves 20 are circular, and do not reach the outer periphery of the semiconductor substrate 60. Therefore, the hydrofluoric acid is prevented from flowing into the grooves 20, and the warpage adjustment film 24 in each of the grooves 20 is not exposed to the hydrofluoric acid. This makes it possible to prevent the warpage adjustment film 24 from being subjected to damage.

(Ion Implanting Process)

Figure 13:
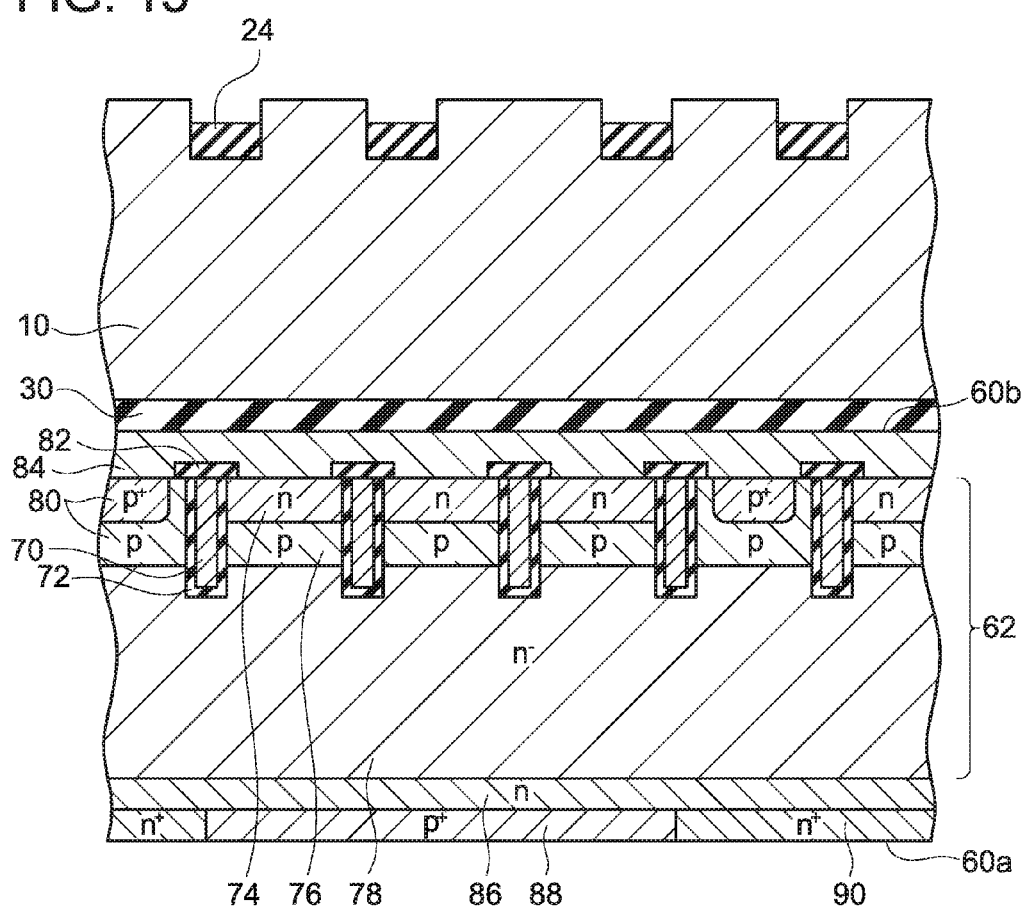
FIG. 13 is a longitudinal sectional view of the semiconductor substrate 60 into which ions have been implanted.

Next, p-type impurities and n-type impurities are selectively implanted into the lower surface of the silicon substrate 62 (i.e. into the lower surface 60a of the semiconductor substrate 60). Furthermore, the p-type impurities and n-type impurities thus implanted are activated by performing laser annealing on the lower surface of the silicon substrate 62. This causes an n-type buffer region 86, a $p^+$-type collector region 88, and an $n^+$-type cathode region 90 to be formed as shown in FIG. 13. The emitter region 74, the body region 76, the drift region 78, the buffer region 86, the collector region 88, the gate electrodes 70, and the like form an IGBT. Further, the anode region 80, the drift region 78, the buffer region 86, and the cathode region 90 form a diode.

It should be noted that, immediately before the ion implanting process, the lower surface of the silicon substrate 62 may be wet etched so that a natural oxide film may be removed from the lower surface. Also in a case where this process is performed, application of damage to the warpage adjustment films 24 is prevented by using the stage 40 in the same manner as in the aforementioned wet etching process.

(Furnace Annealing Process)

Next, the laminate substrate 98 is placed into a furnace and heat-treated at a temperature of 300° C. This recovers crystal defects in the silicon substrate 62 generated during the laser annealing.

(Lower Electrode Forming Process)

Figure 14:
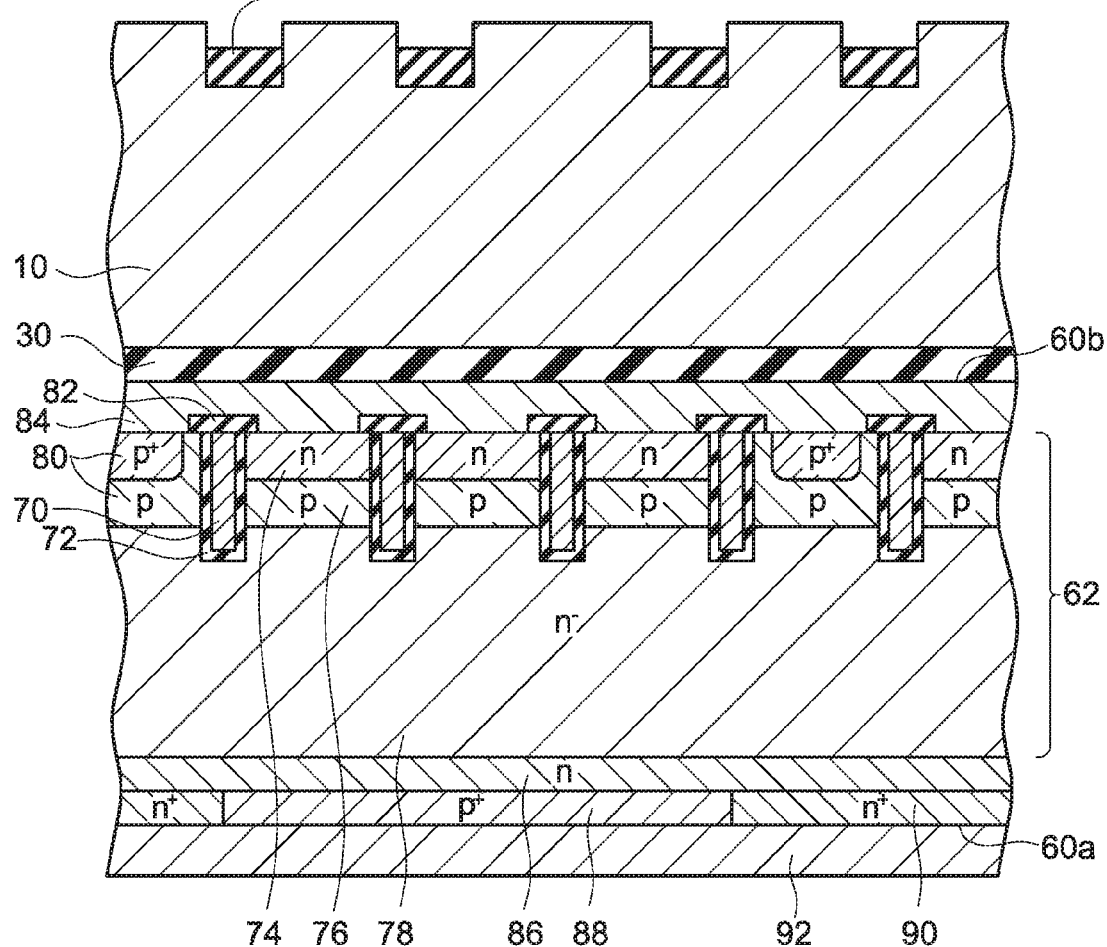
FIG. 14 is a longitudinal sectional view of the semiconductor substrate 60 in which a lower electrode 92 has been formed.

Next, as shown in FIG. 14, a lower electrode 92 is formed on the lower surface of the silicon substrate 62 by sputtering.

It should be noted that, immediately before the lower electrode forming process, the lower surface of the silicon substrate 62 may be wet etched so that a natural oxide film may be removed from the lower surface. Also in a case where this process is performed, application of damage to the warpage adjustment films 24 is prevented by using the stage 40 in the same manner as in the aforementioned wet etching process.

(Dicing Process)

Next, the semiconductor substrate 60 is separated from the support substrate 10. Next, the semiconductor substrate 60 is diced into chips, whereby semiconductor devices are completed. It should be noted that the support substrate 10 from which the semiconductor substrate 60 has been separated can be reused after cleaning. Since little damage is done to the warpage adjustment films 24 during the etching, the support substrate 10 has a long life.

As described above, the method according to Embodiment 1 can suppress occurrence of warpage of the laminate substrate 98 after the attaching and cooling process. This makes it possible to suitably perform processing (i.e. thinning processing, ion implantation, and the like) on the semiconductor substrate 60 after attaching the semiconductor substrate 60 to the support substrate 10.

Further, the method according to Embodiment 1 regulates the warpage of the laminate substrate 98 by a volume change of the warpage adjustment films 24. The volume change of the warpage adjustment films 24 can be effected at a comparatively low temperature (i.e. at a temperature similar to that at which the adhesive 30 is softened). Therefore, the semiconductor devices can be efficiently manufactured. Further, this method, which regulates the warpage of the laminate substrate 98 by the volume change of the warpage adjustment films 24, does not require heating of the support substrate 10 to a distortion point thereof unlike the method of the patent document 1. For this reason, a material with a high distortion point can be employed as a material of which the support substrate 10 is made. That is, as the material of which the support substrate 10 is made, a material can be freely selected regardless of distortion points.

The following will explain a correspondence relationship between the components of Embodiment 1 described above and components of claims. The upper surface 10b of the support substrate 10 of Embodiment 1 is an example of the "one surface of the support substrate" of claims. The SOG solution of Embodiment 1 is an example of the "liquid" of claims. The warpage adjustment film 24 of Embodiment 1 is an example of the "layer of the solidified liquid" of claims. The lower surface 10a of the support substrate 10 of Embodiment 1 is an example of the "surface which has become concave in the warping process due to the phase transition" of claims. The groove 20a of Embodiment 1 is an example of the "first groove" of claims. The groove 20b of Embodiment 1 is an example of the "second groove" of claims. The warpage adjustment film forming process according to Embodiment 1 is an example of the processes of "applying" and the "warping (due to a phase transition)" of claims. The attaching and cooling process according to Embodiment 1 is an example of the processes of "attaching" and the "warping (due to the linear expansion coefficient difference)" of claims.

Embodiment 2

Figure 15:
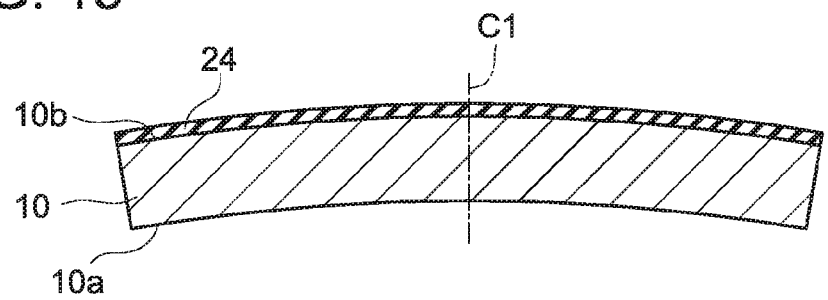
FIG. 15 is an explanatory diagram of a warpage adjustment film forming process according to Embodiment 2.

A method according to Embodiment 2 does not include the process of forming grooves. Therefore, an upper surface 10b of a support substrate 10 is flat, and no grooves 20 are formed in the upper surface 10b of the support substrate 10. Except for the grooves 20, the method according to Embodiment 2 is performed in the same manner as the method according to Embodiment 1. In a warpage adjustment film forming process, as shown in FIG. 15, a warpage adjustment film 24 is formed on a flat upper surface 10b of the support substrate 10. That is, while the support substrate 10 is being rotated around its center C1, SOG solution is applied onto the upper surface 10b of the support substrate 10. Next, the support substrate 10 is heat-treated at a temperature of 300° C. to 400° C. in a furnace. This causes the SOG solution to harden, thereby forming the warpage adjustment film 24. The warpage adjustment film 24 adheres to the flat upper surface 10b. Further, the warpage adjustment film 24 expands when it hardens. Due to this, as the warpage adjustment film 24 expands, the warpage adjustment film 24 applies stress to the upper surface 10b of the support substrate 10, with a result that the support substrate 10 expands on an upper surface 10b side. Contrary to this, the support substrate 10 hardly expands on a lower surface 10a side. Therefore, as shown in FIG. 15, the support substrate 10 is warped (i.e. curved) so that the upper surface 10b becomes convex. Also in such a case where the support substrate 10 having no grooves 20 is used, the support substrate 10 can be warped by the warpage adjustment film 24. However, in Embodiment 2, in which no grooves 20 are used, the warpage of the support substrate 10 in the warpage adjustment film forming process is smaller than that in Embodiment 1, in which the grooves 20 are used. Once the support substrate 10 is thus warped, remaining processes are performed in the same manner as in Embodiment 1. Thus, the method according to Embodiment 2 can also make a laminate substrate 98 flat. The flat laminate substrate 98 enables suitable manufacturing of semiconductor devices. Further, the method according to Embodiment 2 also makes it possible to effect a volume change of the warpage adjustment film 24 at a comparatively low temperature, thus enabling efficient manufacturing of the semiconductor devices.

Embodiment 3

Unlike the method according to Embodiment 1, a method according to Embodiment 3 uses a support substrate 10 configured of a material having a linear expansion coefficient smaller than that of a semiconductor substrate 60. Usable examples of a material of which such a support substrate 10 is made include glass and ceramic. Further, an upper surface 10b and a lower surface 10a of the support substrate 10 used in the method according to Embodiment 3 are flat. Further, the method according to Embodiment 3 does not include the groove forming process.

(Warpage Adjustment Film Forming Process)

Figure 16:
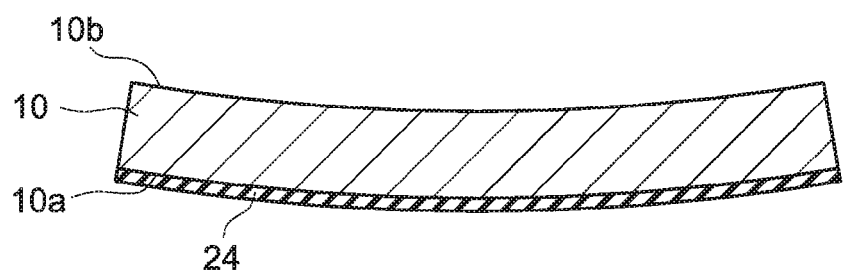
FIG. 16 is an explanatory diagram of a warpage adjustment film forming process according to Embodiment 3.

In the warpage adjustment film forming process of the method according to Embodiment 3, as shown in FIG. 16, a warpage adjustment film 24 configured of SOG is formed on the flat lower surface 10a of the support substrate 10. Therefore, since the warpage adjustment film 24 expands when it hardens, the support substrate 10 is warped so that the lower surface 10a becomes convex.

(Adhesive Applying Process)

In the adhesive applying process according to Embodiment 3, adhesive 30 is formed on an upper surface 60b of a semiconductor substrate 60, as in the adhesive applying process according to Embodiment 1.

(Attaching and Cooling Process)

Figure 17:
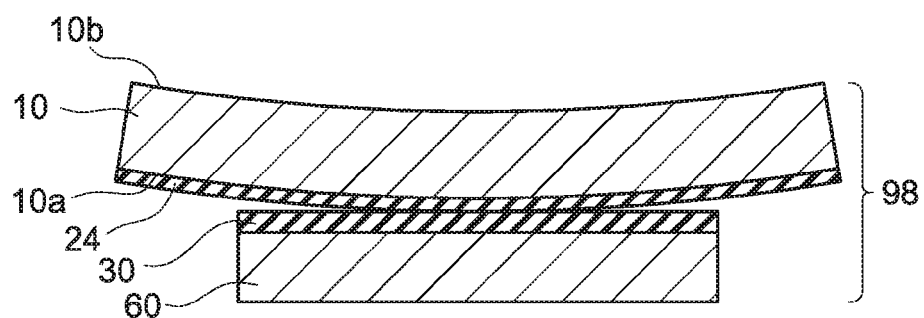
FIG. 17 is an explanatory diagram of an attaching and cooling process according to Embodiment 3.

In the attaching and cooling process according to Embodiment 3, as shown in FIG. 17, the support substrate 10 is placed on top of the adhesive 30. That is, the support substrate 10 is stacked on top of the semiconductor substrate 60. At this point, the warpage adjustment film 24 formed on the lower surface 10a of the support substrate 10 is brought into contact with the adhesive 30. Next, a laminate substrate 98 including the semiconductor substrate 60 and the support substrate 10 is pressed from its top to bottom between pressing plates. This causes the laminate substrate 98 to be pressurized in a vertical direction (i.e. in a direction of stacking). The pressurization causes the support substrate 10 to become flat so that a surface of the warpage adjustment film 24 comes into intimate contact with the adhesive 30. Since the warped support substrate 10 is pressurized to be flat, stress attempting to warp the support substrate 10 so that the lower surface 10a becomes convex is generated in the support substrate 10. This stress is hereinafter referred to as "third stress". Next, while the laminate substrate 98 is being maintained in the pressurized state, the laminate substrate 98 is heated to a temperature higher than a glass transition temperature (approximately 300° C.) of the adhesive 30. The heating causes the adhesive 30 to soften. Next, the laminate substrate 98 is gradually cooled. When the temperature of the laminate substrate 98 becomes lower than the glass transition temperature of the adhesive 30, the adhesive 30 hardens. This causes the semiconductor substrate 60 and the support substrate 10 to be fixed to each other. That is, the semiconductor substrate 60 is attached to the lower surface 10a (i.e. the surface that had been curved convex before the pressurization) of the support substrate 10. After that, the cooling continues until the laminate substrate 98 reaches at a room temperature. In Embodiment 3, the support substrate 10 has a linear expansion coefficient smaller than that of the semiconductor substrate 60. Therefore, during the cooling, the laminate substrate 98 attempts to be warped so that the support substrate 10 side becomes convex. However, since the laminate substrate 98 is restrained by the pressing plates, the laminate substrate 98 is not actually warped. For this reason, stress attempting to warp the laminate substrate 98 so that the support substrate 10 side becomes convex is generated in the laminate substrate 98. This stress is hereinafter referred to as "fourth stress". The fourth stress is stress that acts in a direction opposite to the third stress. Therefore, the third stress and the fourth stress act to cancel each other out.

Once the laminate substrate 98 is cooled to the room temperature, the pressing plates are set apart, and the laminate substrate 98 is taken out. Since the third stress and the fourth stress act to cancel each other out, stress in the laminate substrate 98 is low. Therefore, the laminate substrate 98 is hardly warped even when the pressing plates have been set apart. The method according to Embodiment 3 can make the laminate substrate 98 flat. The subsequent processes are performed in the same manner as in Embodiment 1. Therefore, the method according to Embodiment 3 also enables suitable manufacturing of semiconductor devices, because the laminate substrate 98 is flat. Further, the method according to Embodiment 3 also makes it possible to effect a volume change of the warpage adjustment film 24 at a comparatively low temperature, thus enabling efficient manufacturing of semiconductor devices.

The following will explain a correspondence relationship between the components of Embodiment 3 described above and the components of claims. The lower surface 10a of the support substrate 10 of Embodiment 3 is an example of the "one surface of the support substrate" of claims. The lower surface 10a of the support substrate 10 of Embodiment 3 is an example of the "surface of the support substrate which has become convex" of claims.

In Embodiment 3, the warpage adjustment film 24 is formed on the flat lower surface 10a of the support substrate 10. Alternatively, grooves may be formed in the lower surface 10a, and the warpage adjustment film 24 may be formed in each of the grooves and may be made expanded. This method allows the support substrate 10 to be warped to a greater degree prior to the attaching.

Embodiment 4

A method according to Embodiment 4 uses the same semiconductor substrate 60 and the same support substrate 10 as those used in Embodiment 1. The method according to Embodiment 4 includes the groove forming process in the same manner as in Embodiment 1. Further, in the method according to Embodiment 4, the attaching and cooling process is performed prior to the warpage adjustment film forming process.

(Adhesive Applying Process)

The adhesive applying process is performed prior to the attaching and cooling process. In the adhesive applying process according to Embodiment 4, the adhesive 30 is formed on the upper surface 60b of the semiconductor substrate 60, as in the adhesive applying process according to Embodiment 1.

(Attaching and Cooling Process)

Next, the support substrate 10 is stacked on top of the semiconductor substrate 60. At this stage, the semiconductor substrate 60 and the support substrate 10 are both flat. Next, a laminate substrate 98 is pressurized by pressing plates. Next, as in Embodiment 1, the laminate substrate 98 is heated while being pressurized, and then cooled. This causes the semiconductor substrate 60 to be attached to the lower surface 10a of the support substrate 10 via the adhesive 30. In Embodiment 4, the support substrate 10 has a linear expansion coefficient larger than that of the semiconductor substrate 60. Therefore, during the cooling, the laminate substrate 98 attempts to be warped so that the semiconductor substrate 60 side becomes convex. However, since the laminate substrate 98 is restrained by the pressing plates, the laminate substrate 98 is not actually warped. For this reason, stress attempting to warp the laminate substrate 98 so that the semiconductor substrate 60 side becomes convex is generated in the laminate substrate 98.

Figure 18:
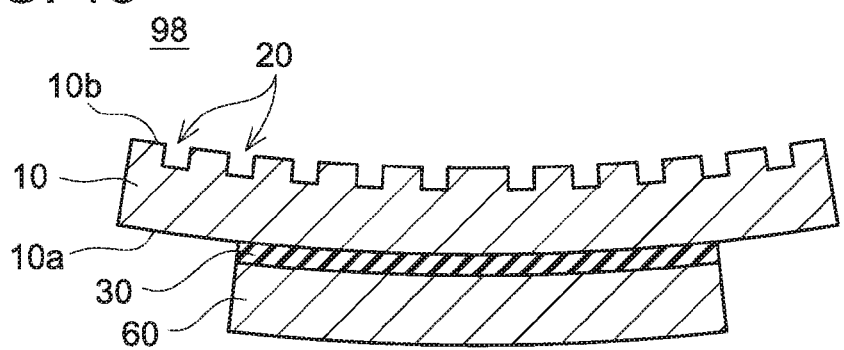
FIG. 18 is an explanatory diagram of an attaching and cooling process according to Embodiment 4.

Once the laminate substrate 98 is cooled to a room temperature, the pressing plates are set apart, and the laminate substrate 98 is taken out. Then, the stress in the laminate substrate 98 is released to warp the laminate substrate 98, as shown in FIG. 18, so that the semiconductor substrate 60 side becomes convex, as shown in FIG. 18.

(Warpage Adjustment Film Forming Process)

Next, the warpage adjustment film forming process is performed. In the warpage adjustment film forming process, as in Embodiment 1, a warpage adjustment film 24 is formed in each of the grooves 20. Since the warpage adjustment films 24 expand when they hardens, the support substrate 10 expands on the upper surface 10b side. This causes the laminate substrate 98 to be warped in a direction opposite to the direction in which the laminate substrate 98 was warped in the attaching and cooling process, thus making the laminate substrate 98 flat. The method according to Embodiment 4 can produce the flat laminate substrate 98. The subsequent processes are performed in the same manner as in Embodiment 1. Therefore, the method according to Embodiment 4 also enables suitable manufacturing of semiconductor devices, as the laminate substrate 98 is flat. Further, the method according to Embodiment 4 also makes it possible to effect a volume change of the warpage adjustment films 24 at a comparatively low temperature, thus enabling efficient manufacturing of semiconductor devices.

The following will explain a correspondence relationship between the components of Embodiment 4 described above and the components of claims. The upper surface 10b of the support substrate 10 of Embodiment 4 is an example of the "one surface of the support substrate" of claims. The upper surface 10b of the support substrate 10 of Embodiment 4 is an example of the "surface which has become concave in the warping process due to the linear expansion coefficient difference" of claims.

In Embodiment 4, the grooves 20 are formed in the upper surface 10b of the support substrate 10. Alternatively, the grooves 20 may not be formed in the upper surface 10b. Even with this configuration, it is possible to produce the laminate substrate 98 flat by forming the warpage adjustment film 24 on the even upper surface 10b including no grooves and expanding the warpage adjustment film 24.

Embodiment 5

A method according to Embodiment 5 does not comprise the groove forming process, but uses a support substrate 10 whose upper surface 10b and lower surface 10a are both flat. The support substrate 10 used in the method according to Embodiment 5 has a linear expansion coefficient larger than that of a semiconductor substrate 60. Further, in Embodiment 5, a material that contracts when it hardens, instead of the SOG, is used as a warpage adjustment film 24.

(Warpage Adjustment Film Forming Process)

Figure 19:
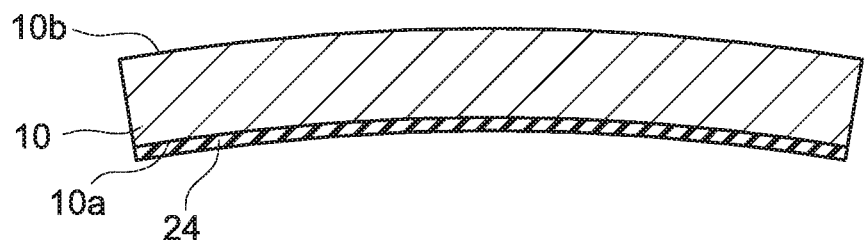
FIG. 19 is an explanatory diagram of a warpage adjustment film forming process according to Embodiment 5.

In the warpage adjustment film forming process according to Embodiment 5, liquid from which the warpage adjustment film 24 is to be made is applied to the flat lower surface 10a of the support substrate 10. Next, the liquid thus applied is hardened by heat treatment to form the warpage adjustment film 24 on the lower surface 10a as shown in FIG. 19. Then, the warpage adjustment film 24 hardens and contracts. This causes the support substrate 10 to contract on the lower surface 10a side and be warped so that the upper surface 10b becomes convex, as shown in FIG. 19.

(Adhesive Applying Process)

In the adhesive applying process according to Embodiment 5, adhesive 30 is formed on an upper surface 60b of the semiconductor substrate 60, as in the adhesive applying process according to Embodiment 1.

(Attaching and Cooling Process)

Figure 20:
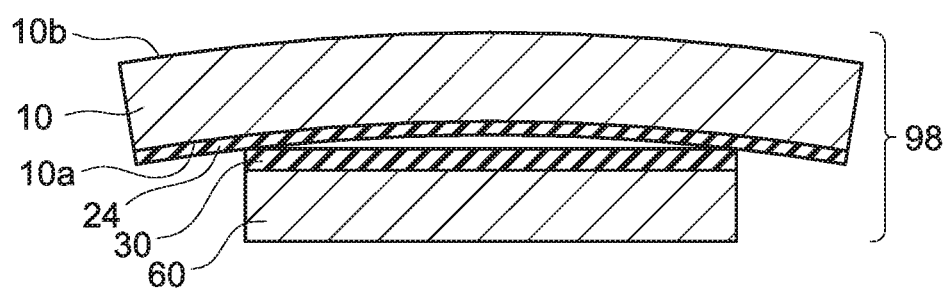
FIG. 20 is an explanatory diagram of an attaching and cooling process according to Embodiment 5.

In the attaching and cooling process according to Embodiment 5, as shown in FIG. 20, the support substrate 10 is placed on top of the adhesive 30. That is, the support substrate 10 is stacked on top of the semiconductor substrate 60. At this point, the warpage adjustment film 24 formed on the lower surface 10a of the support substrate 10 is brought into contact with the adhesive 30. After that, as in Embodiment 1, a laminate substrate 98 shown in FIG. 20 is heated while being pressurized by pressing plates. Next, the laminate substrate 98 is cooled to a room temperature. This causes the semiconductor substrate 60 to be attached to the lower surface 10a (i.e. the surface that had been curved concave before the pressurization) of the support substrate 10 via the adhesive 30. After that, the laminate substrate 98 is taken out from the space between the pressing plates. In Embodiment 5 also, stress acts in the same manner as in Embodiment 1 to make the laminate substrate 98 flat, as the support substrate 10 is warped prior to the attaching so that the upper surface 10b becomes convex and the support substrate 10 has a linear expansion coefficient larger than that of the semiconductor substrate 60. The subsequent processes are performed in the same manner as in Embodiment 1. The method according to Embodiment 5 also enables suitable manufacturing of semiconductor devices, as the laminate substrate 98 is flat. Further, the method according to Embodiment 5 also makes it possible to effect a volume change of the warpage adjustment film 24 at a comparatively low temperature, thus enabling efficient manufacturing of semiconductor devices.

The following will explain a correspondence relationship between the components of Embodiment 5 described above and the components of claims. The lower surface 10a of the support substrate 10 of Embodiment 5 is an example of the "one surface of the support substrate" of claims.

Embodiment 6

A method according to Embodiment 6 uses a support substrate 10 whose upper surface 10b and lower surface 10a are both flat. The support substrate 10 used in the method according to Embodiment 6 has a linear expansion coefficient smaller than that of a semiconductor substrate 60. Further, in Embodiment 6, a material that contracts when it hardens, instead of the SOG, is used as a warpage adjustment film 24.

(Warpage Adjustment Film Forming Process)

Figure 21:
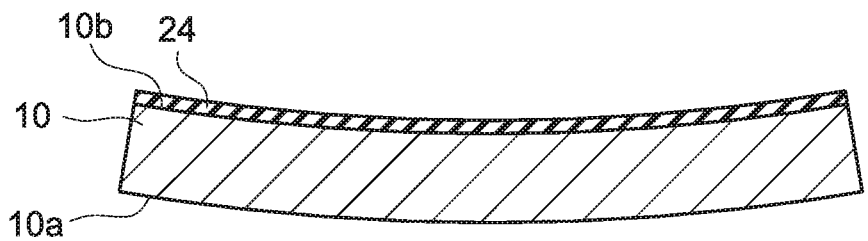
FIG. 21 is an explanatory diagram of a warpage adjustment film forming process according to Embodiment 6.

In the warpage adjustment film forming process according to Embodiment 6, liquid from which the warpage adjustment film 24 is to be made is applied to the flat upper surface 10b of the support substrate 10. Next, the liquid thus applied is hardened by heat treatment to form the warpage adjustment film 24 on the upper surface 10b as shown in FIG. 21. The warpage adjustment film 24 contracts when it hardens. This causes the support substrate 10 to contract on the upper surface 10b side and be warped so that the lower surface 10a becomes convex, as shown in FIG. 21.

(Adhesive Applying Process)

In the adhesive applying process according to Embodiment 6, adhesive 30 is formed on an upper surface 60b of the semiconductor substrate 60, as in the adhesive applying process according to Embodiment 1.

(Attaching and Cooling Process)

Figure 22:
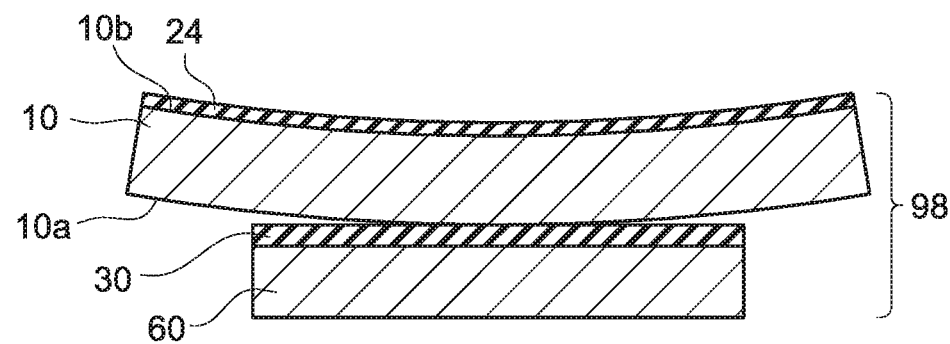
FIG. 22 is an explanatory diagram of an attaching and cooling process according to Embodiment 6.

In the attaching and cooling process according to Embodiment 6, as shown in FIG. 22, the support substrate 10 is placed on top of the adhesive 30. That is, the support substrate 10 is stacked on top of the semiconductor substrate 60. At this point, the lower surface 10a of the support substrate 10 is brought into contact with the adhesive 30. After that, as in Embodiment 1, a laminate substrate 98 shown in FIG. 22 is heated while being pressurized by pressing plates. Next, the laminate substrate 98 is cooled to a room temperature. This causes the semiconductor substrate 60 to be attached to the lower surface 10a (i.e. the surface that had been curved convex before the pressurization) of the support substrate 10 via the adhesive 30. After that, the laminate substrate 98 is taken out from the space between the pressing plates. In Embodiment 6 also, stress acts in the same manner as in Embodiment 3 to make the laminate substrate 98 flat, as the support substrate 10 is warped prior to the attaching so that the lower surface 10a becomes convex and the support substrate 10 has a linear expansion coefficient smaller than that of the semiconductor substrate 60. The subsequent processes are performed in the same manner as in Embodiment 1. The method according to Embodiment 6 also enables suitable manufacturing of semiconductor devices, as the laminate substrate 98 is flat. Further, the method according to Embodiment 6 also makes it possible to effect a volume change of the warpage adjustment film 24 at a comparatively low temperature, thus enabling efficient manufacturing of semiconductor devices.

The following will explain a correspondence relationship between the components of Embodiment 6 described above and the components of claims. The upper surface 10b of the support substrate 10 of Embodiment 6 is an example of the "one surface of the support substrate" of claims.

Embodiment 7

A method according to Embodiment 7 does not comprise the groove forming process, but uses a support substrate 10 whose upper surface 10b and lower surface 10a are both flat. The support substrate 10 used in the method according to Embodiment 7 has a linear expansion coefficient smaller than that of a semiconductor substrate 60. Further, in the method according to Embodiment 7, a material that contracts when it hardens, instead of the SOG, is used as a warpage adjustment film 24. Further, in the method according to Embodiment 7, an attaching and cooling process is performed prior to a warpage adjustment film forming process.

(Adhesive Applying Process)

An adhesive applying process is performed prior to the attaching and cooling process. In the adhesive applying process according to Embodiment 7, adhesive 30 is formed on an upper surface 60b of the semiconductor substrate 60, as in the adhesive applying process according to Embodiment 1.

(Attaching and Cooling Process)

Figure 23:
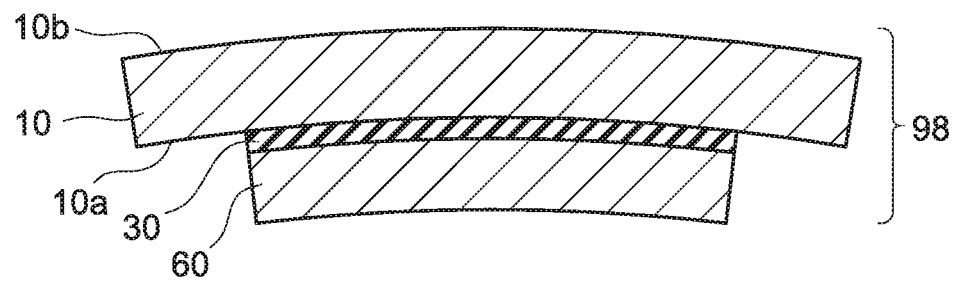
FIG. 23 is an explanatory diagram of an attaching and cooling process according to Embodiment 7.

Next, the support substrate 10 is stacked on top of the semiconductor substrate 60, and the attaching and cooling process is performed in the same manner as in Embodiment 4. This causes the semiconductor substrate 60 to be attached to the lower surface 10a of the support substrate 10. After that, a laminate substrate 98 is taken out from the space between the pressing plates. In Embodiment 7, unlike in Embodiment 4, the support substrate 10 has a linear expansion coefficient smaller than that of the semiconductor substrate 60. Therefore, the laminate substrate 98 taken out from the space between the pressing plates is warped in a direction opposite to the direction in which the laminate substrate 98 is warped in Embodiment 4. That is, as shown in FIG. 23, the laminate substrate 98 is warped so that the support substrate 10 side becomes convex.

(Warpage Adjustment Film Forming Process)

Next, the warpage adjustment film forming process is performed. In the warpage adjustment film forming process, liquid from which the warpage adjustment film 24 is to be made is applied to the flat upper surface 10b of the support substrate 10. Next, the liquid thus applied is hardened by heat treatment to form the warpage adjustment film 24 on the upper surface 10b. The warpage adjustment film 24 hardens and contracts. This causes the laminate substrate 98 to be warped in a direction opposite to the direction in which the laminate substrate 98 was warped in the attaching and cooling process, thus making the laminate substrate 98 flat. The method according to Embodiment 7 can make the laminate substrate 98 flat. The subsequent processes are performed in the same manner as in Embodiment 1. Therefore, the method according to Embodiment 7 also enables suitable manufacturing of semiconductor devices, as the laminate substrate 98 is flat.

Further, the method according to Embodiment 7 also makes it possible to effect a volume change of the warpage adjustment film 24 at a comparatively low temperature, thus enabling efficient manufacturing of semiconductor devices.

The following will explain a correspondence relationship between the components of Embodiment 7 described above and the components of claims. The upper surface 10b of the support substrate 10 of Embodiment 7 is an example of the "one surface of the support substrate" of claims.

In any of Embodiments 1 to 7, as described above, a warping direction of the support substrate 10 in the warpage adjustment film forming process and a warping direction of the support substrate 10 in the attaching and cooling process are opposite to each other. For this reason, the warpage of the laminate substrate 98 that is finally obtained can be suppressed.

Figure 24:
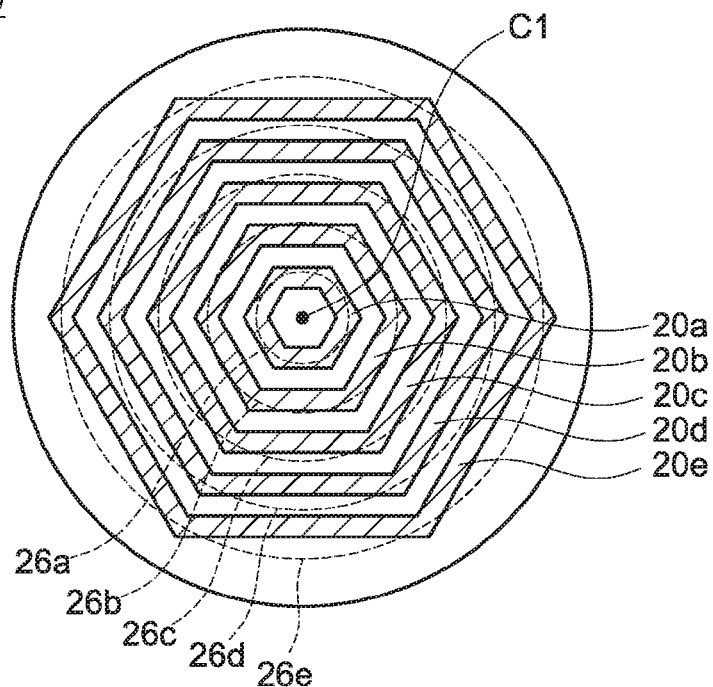
FIG. 24 is a plan view of a support substrate 10 according to a modification, with grooves 20 indicated by diagonal hatching.
Figure 25:
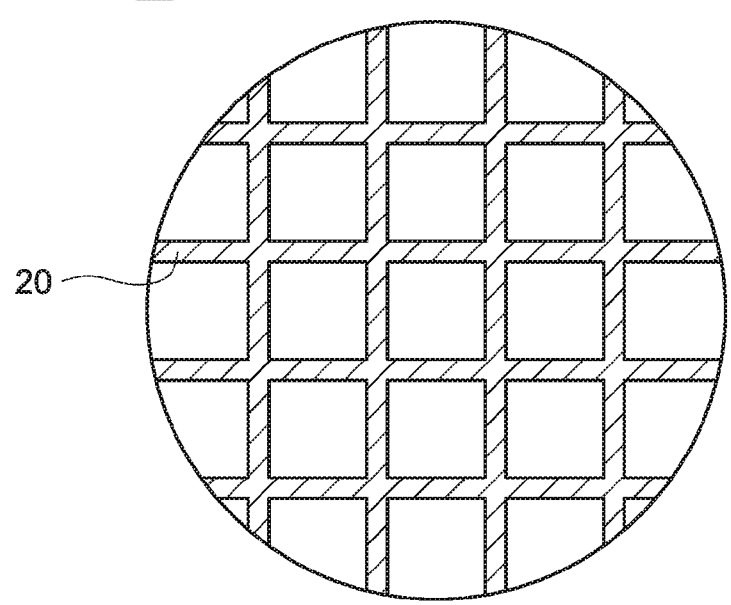
FIG. 25 is a plan view of a support substrate 10 according to a modification, with grooves 20 indicated by diagonal hatching.

In each of Embodiments 1 and 4 described above, the grooves 20a to 20e are formed concentrically. Alternatively, as shown in FIG. 24, the grooves 20a to 20e may be formed in polygonal shapes extending along concentric circles 26a to 26e centered at center C1 of a support substrate 10. The grooves extending in polygonal shapes can also bring about effects which are similar to those which are brought about by the grooves extending concentrically. Further alternatively, grooves 20 of a support substrate 10 may be formed in a gridlike fashion as shown in FIG. 25. The configuration shown in FIG. 25 makes it easy to process the grooves 20.

Further, in each of Embodiments 1 to 7 described above, the laminate substrate 98 is heated in a state where the semiconductor substrate 60, the adhesive 30, and the support substrate 10 are stacked, whereby the semiconductor substrate 60 is attached to the support substrate 10. Alternatively, the support substrate 10 and the semiconductor substrate 60 may be heated separately, and in the heated state, and the support substrate 10 may be then attached to the semiconductor substrate 60 via the adhesive 30.

Further, in each of Embodiments 1 to 7 described above, the adhesive 30 via which the semiconductor substrate 60 is attached to the support substrate 10 is thermoplastic. Alternatively, the semiconductor substrate 60 may be attached to the support substrate 10 by another method, e.g. by using another adhesive such as a thermosetting adhesive.

Further, in each of Embodiments 1 to 7 described above, the semiconductor substrate 60 is configured mainly of silicon. Alternatively, the semiconductor substrate 60 may be configured of another semiconductor such as SiC or GaN.

Further, in Embodiment 1 described above, a sapphire substrate is used as the support substrate 10. Since sapphire has transparency, it excels in terms of making it possible to see a surface of the semiconductor substrate 60 even after the attachment of the support substrate 10. Alternatively, the support substrate 10 may be made of a material other than sapphire.

The following will enumerate technical elements disclosed herein. It should be noted that the following technical elements are each independently useful.

In a method disclosed herein as an example, the support substrate may have a linear expansion coefficient larger than that of the semiconductor substrate. The process of formation and volume change of the warpage adjustment film may be performed prior to the process of attaching and cooling of the semiconductor substrate. In the process of formation and volume change of the warpage adjustment film, the support substrate may be warped. In the process of attaching and cooling of the semiconductor substrate, the semiconductor substrate may be attached to the concave surface of the support substrate.

In a method disclosed herein as an example, liquid may have a property of expanding in volume when solidified. The support substrate may have a linear expansion coefficient larger than that of the semiconductor substrate. The warping process due to phase transition may be performed prior to the warping process due to linear expansion coefficient difference. The support substrate may warp in the warping process due to the phase transition so that the surface to which the liquid has been applied becomes convex. The semiconductor substrate may be attached after the warping process due to the phase transition to a surface which has become concave.

In a method disclosed herein as an example, liquid may have a property of expanding in volume when solidified. The support substrate may have a linear expansion coefficient smaller than that of the semiconductor substrate. The warping process due to the phase transition may be performed prior to the warping process due to the linear expansion coefficient difference. The support substrate may warp in the warping process due to the phase transition so that the surface to which the liquid has been applied becomes convex. The semiconductor substrate may be attached after the warping process due to the phase transition to the surface of the support substrate which has become convex.

In a method disclosed herein as an example, liquid may have a property of expanding in volume when solidified. One surface of the support substrate may include a groove. The liquid in the groove may be solidified in the warping process due to the phase transition.

This method allows the support substrate to be warped to a greater degree.

In a method disclosed herein as an example, the liquid may be solidified so that a surface of a layer of the solidified liquid is located on a bottom side with respect to an opening of the groove.

This method makes it easy to handle the support substrate, as the layer of the solidified liquid does not project outward from the opening of the groove.

In a method disclosed herein as an example, the groove may comprise a first groove extending circularly around a center of the one surface, and a second groove extending circularly around the first groove.

This method can make a laminate substrate including the support substrate and the semiconductor substrate flatter.

A method disclosed herein as an example may further comprise processes of mounting the support substrate to which the semiconductor substrate is attached on a stage so that the one surface (i.e., the surface in which the groove is provided) of the support substrate is in contact with the stage, and etching the semiconductor substrate mounted on the stage.

This method can prevent etching of the layer in the groove (i.e. the layer of the solidified liquid), as the opening of the groove is covered by the stage. This allows the support substrate to have a longer life.

In a method disclosed herein as an example, liquid may have a property of expanding in volume when solidified. The support substrate may have a linear expansion coefficient larger than that of the semiconductor substrate. The warping process due to the linear expansion coefficient difference may be performed prior to the warping process due to the phase transition. The liquid may be applied to a surface of the support substrate which has become concave in the warping process due to the linear expansion coefficient difference.

The embodiments have been described in detail in the above. However, these are only examples and do not limit the scope of claims. The technology described in the claims includes various modifications and changes of the concrete examples represented above. The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

What is claimed is:

1. A method for manufacturing a semiconductor device, the method comprising:
    applying liquid to one surface of a support substrate, the one surface of the support substrate including a groove, the liquid being in the groove and having a property of expanding in volume when solidified;
    warping the support substrate by a volume change due to a phase transition of the liquid in the groove by solidifying the liquid;
    attaching a semiconductor substrate having a linear expansion coefficient different from that of the support substrate to the support substrate in a heated state; and
    warping the support substrate due to a linear expansion coefficient difference between the semiconductor substrate and the support substrate by cooling the support substrate to which the semiconductor substrate is attached,
    wherein
    a warping direction due to the phase transition is opposite to a warping direction due to the linear expansion coefficient difference.

2. The method of claim 1, wherein
    the liquid has a property of expanding in volume when solidified,
    the support substrate has a linear expansion coefficient larger than that of the semiconductor substrate,
    the warping process due to the phase transition is performed prior to the warping process due to the linear expansion coefficient difference,
    the support substrate warps in the warping process due to the phase transition so that the surface to which the liquid has been applied becomes convex, and
    the semiconductor substrate is attached after the warping process due to the phase transition to a surface of the support substrate which has become concave.

3. The method of claim 1, wherein
    the liquid has a property of expanding in volume when solidified,
    the support substrate has a linear expansion coefficient smaller than that of the semiconductor substrate,
    the warping process due to the phase transition is performed prior to the warping process due to the linear expansion coefficient difference,
    the support substrate warps in the warping process due to the phase transition so that the surface to which the liquid has been applied becomes convex, and
    the semiconductor substrate is attached to the surface which has become convex after the warping process due to the phase transition.

4. The method of claim 1, wherein
    the liquid is solidified so that a surface of a layer of the solidified liquid is located on a bottom side with respect to an opening of the groove.

5. The method of claim 1, wherein
    the groove comprises:
    a first groove extending circularly around a center of the one surface, and
    a second groove extending circularly around the first groove.

6. The method of claim 5, further comprising:
mounting the support substrate to which the semiconductor substrate is attached on a stage so that the one surface of the support substrate is in contact with the stage; and
etching the semiconductor substrate mounted on the stage.

7. The method of claim 1, wherein
the liquid has a property of expanding in volume when solidified,
the support substrate has a linear expansion coefficient larger than that of the semiconductor substrate,
the warping process due to the linear expansion coefficient difference is performed prior to the warping process due to the phase transition, and
the liquid is applied to a surface of the support substrate which has become concave in the warping process due to the linear expansion coefficient difference.

\* \* \* \* \*